US009708419B2

(12) United States Patent
Ameduri et al.

(10) Patent No.: US 9,708,419 B2
(45) Date of Patent: Jul. 18, 2017

(54) CONTROLLED FREE-RADICAL COPOLYMERIZATION OF TRIFLUOROETHYLENE

(71) Applicants: ARKEMA FRANCE, Colobmes (FR); ECOLE NATIONALE SUPERIEURE DE CHIMIE DE MONTPELLIER, Montpellier (FR)

(72) Inventors: Bruno Ameduri, Montpellier (FR); Ali Alaaeddine, Beyrouth (LB)

(73) Assignees: ARKEMA FRANCE, Colombes (FR); ECOLE NATIONALE SUPERIEURE DE CHIME DE MONTPELLIER, Montpellier (FR)

( * ) Notice: Subject to any disclaimer, the term of this patent is extended or adjusted under 35 U.S.C. 154(b) by 0 days.

(21) Appl. No.: 14/396,528

(22) PCT Filed: Apr. 25, 2013

(86) PCT No.: PCT/FR2013/050920
§ 371 (c)(1),
(2) Date: Oct. 23, 2014

(87) PCT Pub. No.: WO2013/160621
PCT Pub. Date: Oct. 31, 2013

(65) Prior Publication Data
US 2015/0119523 A1 Apr. 30, 2015

(30) Foreign Application Priority Data

Apr. 26, 2012 (FR) ...................... 12 53838

(51) Int. Cl.
C08F 2/38 (2006.01)
C08F 214/22 (2006.01)
C08J 5/22 (2006.01)
C08F 293/00 (2006.01)
C09D 127/16 (2006.01)
C09D 153/00 (2006.01)
C08F 214/18 (2006.01)

(52) U.S. Cl.
CPC .............. *C08F 2/38* (2013.01); *C08F 214/18* (2013.01); *C08F 214/182* (2013.01); *C08F 214/22* (2013.01); *C08F 293/005* (2013.01); *C08J 5/2237* (2013.01); *C09D 127/16* (2013.01); *C09D 153/00* (2013.01); *C08F 2438/00* (2013.01); *C08F 2438/03* (2013.01)

(58) Field of Classification Search
CPC ........................ C09D 127/16; C08F 214/182
See application file for complete search history.

(56) References Cited

U.S. PATENT DOCUMENTS

| 4,158,678 | A | * | 6/1979 | Tatemoto | ............ C08F 293/005 522/135 |
| 4,560,737 | A | * | 12/1985 | Yamamoto | .............. C08L 27/16 264/288.4 |
| 5,198,136 | A | * | 3/1993 | Tatemoto | .............. C08F 293/00 428/835.8 |
| 5,350,878 | A | | 9/1994 | Caporiccio | |
| 5,389,725 | A | * | 2/1995 | Bando | ...................... C08L 27/12 525/146 |
| 5,605,971 | A | * | 2/1997 | Arcella | ................. C08F 293/00 525/276 |
| 6,277,937 | B1 | | 8/2001 | Duvalsaint et al. | |
| 2001/0023280 | A1 | | 9/2001 | Duvalsaint et al. | |
| 2008/0306196 | A1 | | 12/2008 | Irie et al. | |
| 2009/0202769 | A1 | * | 8/2009 | Masuda | ................... C08L 27/18 428/36.92 |
| 2009/0250588 | A1 | | 10/2009 | Robeson et al. | |
| 2011/0111156 | A1 | * | 5/2011 | Durali | ................... C08F 214/22 428/36.9 |
| 2013/0225712 | A1 | * | 8/2013 | Asandei | ................. C08F 14/18 522/67 |

FOREIGN PATENT DOCUMENTS

| CN | 1989202 A | 6/2007 |
| CN | 101691412 A | 4/2010 |
| EP | 0947527 A1 * | 10/1999 .......... C08F 293/005 |
| WO | 0160869 A1 | 8/2001 |
| WO | 2006011547 A1 | 2/2006 |
| WO | 2007081876 A2 | 7/2007 |

OTHER PUBLICATIONS

Hahn et al. "Synthesis of vinylidene fluoride-trifluoroethylene copolymers", Polymer Preprints (Americal Chemcial Society, Division of Polymer Chemistry), 1986, 27(1), 364-365.*
Boyer et al. "Iodine Transfer Polymerization (ITP) of Vinylidene Fluoride (VDF) Influence of the Defect of VDF Chaining on the Control of ITP", Macromolecules, 2005, 38, 10353-10362.*
Ameduri, "From Vinylidene Fluoride (VDF) to the Applications of VDF-Containing Polymers and Copolymers: Recent Developments and Future Trends", Chem. Rev. 2009, 109, 6632-6686.*
Balague et al. "Controlled Step-wise telomerization of vinylidene fluoride, hexafluoropropylene, and trifluoroethylene with iodofluorinated transfer agents", Journal of Fluorine Chemistry, 2000, 102, 253-268.*
Bruno A., "Controlled Radical (Co)polymerization of Fluoromonomers", Macromolecules, American Chemical Society, vol. 43, No. 24, pp. 10163-10184, Dec. 28, 2010.

(Continued)

Primary Examiner — Nicole M Buie-Hatcher
(74) Attorney, Agent, or Firm — Millen, White, Zelano and Branigan, P.C.

(57) ABSTRACT

The invention concerns a method for preparing block copolymers, comprising a step of controlled free-radical copolymerisation of trifluoroethylene with at least one additional monomer, different from trifluoroethylene, in the presence of a chain transfer agent, said chain transfer agent being a xanthate compound, a trithiocarbonate compound or a monoiodide compound. The invention also concerns the block copolymers likely to be obtained by this method.

23 Claims, 6 Drawing Sheets

(56) References Cited

OTHER PUBLICATIONS

Bruno Ademuri, "From Vinylidene Fluoride (VDF)-Containing Polymers and Copolymers: Recent Developments and Future Trends", Chemical Reviews, American Chemical Society, vol. 109, No. 12, pp. 6632-6686, Dec. 9, 2009.
International Search Report for PCT/FR2013/050920 dated Dec. 6, 2013.
English Abstract of CN 101691412 dated Apr. 7, 2010.
English translation of first Office Action in corresponding Japanese Patent Application No. 2015-507585 mailed on Oct. 4, 2016.

* cited by examiner

CONTROLLED FREE-RADICAL COPOLYMERIZATION OF TRIFLUOROETHYLENE

FIELD OF THE INVENTION

The present invention relates to a process for free-radical copolymerization of fluorinated monomers and particularly of trifluoroethylene and of additional monomers other than trifluoroethylene, which is controlled by a xanthate or trithiocarbonate or monoiodinated compound. The invention also makes it possible to prepare thermoplastic block copolymers by virtue of this process. The invention also provides the thermoplastic block copolymers that can be thus obtained.

TECHNICAL BACKGROUND

Fluoropolymers represent a class of compounds which have notable properties for a large number of applications, from paint or special coatings to leaktight seals, with optics, microelectronics and membrane technology in between. Among these fluoropolymers, copolymers are particularly advantageous because of their diversity, their morphology, their exceptional properties and their versatility.

Most copolymerization reactions carried out in the prior art for preparing fluorinated copolymers are "conventional" free-radical reactions.

For example, the article by Yagi et al., in *Polymer Journal* 6:429-436 (1979), describes a conventional copolymerization of vinylidene fluoride with trifluoroethylene. These copolymers have particularly advantageous piezoelectric properties, as is discussed in the article by Higashihata et al., in *Ferroelectrics* 2:85-92 (1981).

The articles by Wang et al., in *Macromolecules* 39:4268-4271 (2006), by Lu et al., in *Macromolecules* 39:6962-6968 (2006) and by Zhang et al., in *Macromolecules* 40:783-785 (2007), describe a process for preparing terpolymers of vinylidene fluoride, trifluoroethylene and chlorotrifluoroethylene by copolymerization of vinylidene fluoride with chlorotrifluoroethylene, followed by reduction of the chlorine atoms of the chlorotrifluoroethylene units.

Moreover, techniques for controlled free-radical copolymerization, i.e. making it possible to obtain control of the molar mass and of the polydispersity index of the polymers, and also synthesis of copolymers with controlled architectures (block, grafted, alternating, gradient, hyperbranched, etc.), have also been proposed.

Document U.S. Pat. No. 6,355,749 describes the preparation of terpolymers of vinylidene fluoride, trifluoroethylene and a comonomer such as chlorotrifluoroethylene or hexafluoropropene, according to a process for controlled copolymerization by means of borane compounds in the presence of oxygen. Likewise, the article by Chung et al., in *Macromolecules* 35:7678-7684 (2002), describes the production of terpolymers of vinylidene fluoride, trifluoroethylene and a chlorinated comonomer, also according to controlled copolymerization by means of borane compounds. This technique is difficult to implement in practice because of the high cost of the borane compounds and the risk of explosion that they create.

Moreover, it has been possible to prepare some copolymers by methods of free-radical copolymerization controlled by means of xanthate compounds as chain transfer agents, under the name MADIX, for "Macromolecular Design via Interchange of Xanthates"; or else by means of iodinated compounds as chain transfer agents.

Two reviews summarizing relevant works in the field have been published in *Macromolecules* 43:10163-10184 (2010) and in *Chem. Rev.* 109:6632-6686 (2009).

The article by Kostov et al., in *Macromolecules* 44:1841-1855 (2011), describes the production of fluorinated block copolymers using a technique of MADIX type. According to the same strategy, the article by Girard et al., in *ACS Macro Letters*, 2012, 1, 270-274, reports the synthesis of copolymers based on vinylidene fluoride and on perfluoromethyl vinyl ether.

The article by Liu et al., in *Chem. Comm.*, 47:7839-7841 (2011), provides another example of a xanthate-controlled copolymerization process, concerning copolymers based on chlorotrifluoroethylene and on vinyl ethers exclusively.

The article by Boyer et al., in *Journal of Polymer Science A*, 47:4710-4722 (2009), describes the synthesis of copolymers of vinylidene fluoride and α-trifluoromethacrylic acid using iodinated compounds as chain transfer agents.

The article by Boyer et al., in *Macromolecules* 43:3652-3663 (2010), describes the copolymerization of vinylidene fluoride and of perfluoromethyl vinyl ether using iodinated compounds as chain transfer agents. Document US 2009/0105435 describes perfluoromethyl vinyl ether-based diiodinated co-oligomers, according to the same method.

Document WO 01/60869 describes the synthesis of fluorinated elastomers by copolymerization, in an aqueous medium, of VDF with HFP, TFE, CTFE or PAVE (perfluoroalkoxy alkyl vinyl ethers) and of a third comonomer considered to be a monomer with a brominated or iodinated crosslinking site providing subsequent crosslinking.

Finally, document US 2008/0081195 describes terpolymers, such as terpolymers of vinylidene fluoride, trifluoroethylene and chlorotrifluoroethylene, which have two functional end groups and which are prepared by polymerization controlled by borane or diiodinated transfer agents.

However, there is still a need to develop new thermoplastic fluorinated copolymers, in particular by means of controlled free-radical copolymerization methods.

There is quite particularly a need to produce block copolymers based on trifluoroethylene (and in particular based on vinylidene fluoride and on trifluoroethylene) by controlled free-radical copolymerization, more simply and more reliably than in the prior art.

There is also a need to have block copolymers based on trifluoroethylene and in particular based on vinylidene fluoride and on trifluoroethylene, or based on vinylidene fluoride, on trifluoroethylene and on a third comonomer.

SUMMARY OF THE INVENTION

The invention relates firstly to a process for preparing a thermoplastic copolymer, comprising a step of controlled free-radical copolymerization of a trifluoroethylene monomer with at least one additional monomer, different than trifluoroethylene, in the presence of a chain transfer agent, said chain transfer agent being a xanthate compound, a trithiocarbonate compound or a monoiodinated compound.

The monomer(s) present during the copolymerization step:
consist(s) of vinylidene fluoride and trifluoroethylene; or
comprise(s) vinylidene fluoride, trifluoroethylene and at least one additional monomer.

According to one embodiment, the additional monomer(s) is (are) chosen from fluorinated monomers, and preferably from 2,3,3,3-tetrafluoropropene, vinyl fluoride, 2-chloro-1,1-difluoroethylene, 2-bromo-1,1-difluoroethylene, hexafluoropropene, 3,3,3-trifluoropropene, 3,3,3-trifluoro- 2-chloropropene, 1,1,1,3-tetrafluoropropene, 3,3,3-trifluoro-2-bromopropene, 1H-penta-fluoropropene, 2H-pentafluoropropene, perfluoromethyl vinyl ether, perfluoroethyl vinyl ether, perfluoropropyl vinyl ether, α-trifluoromethacrylic acid and its derivatives; or are chosen from hydrogenated monomers, and preferably from vinyl acetate, N-vinylpyrrolidone, methacrylates, acrylates, acrylamide, N-vinylcarbazole, acrylonitrile and allyl monomers such as allyl alcohols, allyl acetate, allyl halides or allyl glycidyl ether; or are chosen from combinations thereof.

The copolymer prepared is a thermoplastic block copolymer. This means that the copolymers according to the invention are semicrystalline melt polymers. The controlled free-radical copolymerization process used is of the RAFT/MADIX type (via reversible addition-fragmentation chain transfer).

According to one embodiment, the chain transfer agent is a xanthate or trithiocarbonate compound which is a compound of formula $R_1$—S—C(=S)—Z, in which $R_1$ represents an aliphatic group comprising from 1 to 20 carbon atoms, —Z represents an —O—$R_2$ group in which $R_2$ represents an alkyl or aryl group comprising from 1 to 10 carbon atoms or —Z represents an —S—$R_3$ group, in which $R_3$ represents an aliphatic group comprising from 1 to 20 carbon atoms.

According to one embodiment, the xanthate or trithiocarbonate compound is O-ethyl-S-(1-methyloxycarbonyl)ethyl xanthate.

According to one embodiment, the chain transfer agent is a monoiodinated compound which is a 1-iodofluoroalkane, and which is preferably a compound of formula $R_F$—$(CH_2CF_2)_n$—I, in which n is an integer ranging from 1 to 500, and $R_F$ represents a perfluorocarbon group, more particularly preferably chosen from the $CF_3$, $C_2F_5$, $C_3F_7$ and $C_mF_{2m+1}$ groups, m being an even integer ranging from 4 to 20.

The invention also relates to a copolymer which has trifluoroethylene units and which has a xanthate or trithiocarbonate or monoiodinated end group.

According to one embodiment, the copolymer has:
  trifluoroethylene units and additional units different than vinylidene fluoride; or
  trifluoroethylene and vinylidene fluoride units only; or
  trifluoroethylene and vinylidene fluoride units and additional units.

According to one embodiment, the additional units are chosen from fluorinated units, and preferably from the following units: 2,3,3,3-tetrafluoropropene, vinyl fluoride, 2-chloro-1,1-difluoroethylene, 2-bromo-1,1-difluoroethylene, hexafluoropropene, 3,3,3-trifluoropropene, 3,3,3-trifluoro-2-chloropropene, 1,1,1,3-tetrafluoropropene, 3,3,3-trifluoro-2-bromopropene, 1H-pentafluoropropene, 2H-pentafluoropropene, perfluoromethyl vinyl ether, perfluoroethyl vinyl ether, perfluoropropyl vinyl ether, α-trifluoromethacrylic acid and its derivatives; or chosen from hydrogenated units, and preferably from the following units: vinyl acetate, N-vinylpyrrolidone, methacrylates, acrylates, acrylamide, N-vinylcarbazole, acrylonitrile and allyl units such as allyl alcohol, allyl acetate, allyl halide or allyl glycidyl ether units; or are chosen from combinations thereof.

According to one embodiment, the copolymer has a xanthate or trithiocarbonate end group which is an —S—C(=S)—Z group, —Z representing an —O—$R_2$ group in which $R_2$ represents an alkyl or aryl group comprising from 1 to 10 carbon atoms or —Z representing an —S—$R_3$ group in which $R_3$ represents an aliphatic group comprising from 1 to 20 carbon atoms.

According to one embodiment, the xanthate or trithiocarbonate end group is an —S—C(=S)—O—$C_2H_5$ or —S—C(=S)—S—$C_{12}H_{25}$ group.

According to one embodiment, the copolymer is a block copolymer, at least one block of which comprises trifluoroethylene units, or is a homo-poly(trifluoroethylene) block.

According to one embodiment, at least one block comprises vinylidene fluoride units.

According to one embodiment, at least one block comprises vinylidene fluoride and trifluoroethylene units.

According to one embodiment, at least one block comprises units chosen from fluorinated units, and preferably from the following units: 2,3,3,3-tetrafluoropropene, vinyl fluoride, 2-chloro-1,1-difluoroethylene, 2-bromo-1,1-difluoroethylene, hexafluoropropene, 3,3,3-trifluoropropene, 3,3,3-trifluoro-2-chloropropene, 1,1,1,3-tetrafluoropropene, 3,3,3-trifluoro-2-bromopropene, 1H-pentafluoropropene, 2H-pentafluoropropene, perfluoromethyl vinyl ether, perfluoroethyl vinyl ether, perfluoropropyl vinyl ether, α-trifluoromethacrylic acid and its derivatives; or chosen from hydrogenated units, and preferably from the following units: vinyl acetate, N-vinylpyrrolidone, methacrylates, acrylates, acrylamide, N-vinylcarbazole, acrylonitrile and allyl units such as allyl alcohol, allyl acetate, allyl halide or allyl glycidyl ether units; or chosen from combinations thereof.

According to one embodiment, the block copolymer comprises:
  a poly(vinylidene fluoride) homopolymer block (homo-poly(trifluoroethylene)) and a copolymer block comprising vinylidene fluoride and trifluoroethylene units and optionally additional units; or
  a copolymer block comprising vinylidene fluoride and trifluoroethylene units and a copolymer block comprising vinylidene fluoride and trifluoroethylene units and additional units.

According to one embodiment, the block copolymer comprises:
  a poly(vinylidene fluoride) homopolymer block and a copolymer block comprising vinylidene fluoride, trifluoroethylene and 2,3,3,3-tetrafluoropropene units; or
  a copolymer block comprising vinylidene fluoride and trifluoroethylene units and a copolymer block comprising vinylidene fluoride, trifluoroethylene and 2,3,3,3-tetrafluoropropene units; or
  a poly(vinylidene fluoride) homopolymer block and a copolymer block comprising only vinylidene fluoride and trifluoroethylene units.

The subject of the invention is also a process for preparing a copolymer (c), comprising a step of reacting a copolymer (a), as described above, with at least one comonomer (b).

According to one embodiment, the copolymer (c) is a block copolymer described above.

According to one embodiment, the comonomer (b) is chosen from fluorinated monomers, and preferably from vinylidene fluoride, 2,3,3,3-tetrafluoropropene, vinyl fluoride, 2-chloro-1,1-difluoroethylene, 2-bromo-1,1-difluoroethylene, hexafluoropropene, 3,3,3-trifluoropropene, 3,3,3-trifluoro-2-chloropropene, 1,1,1,3-tetrafluoropropene, 3,3,3-trifluoro-2-bromopropene, 1H-pentafluoropropene, 2H-pentafluoropropene, perfluoromethyl vinyl ether, perfluoroethyl vinyl ether, perfluoropropyl vinyl ether, α-trifluoromethacrylic acid and its derivatives; or is chosen from hydrogenated monomers, and preferably from vinyl acetate, N-vinylpyrrolidone, methacrylates, acrylates, acrylamide, N-vinylcarbazole, acrylonitrile and allyl monomers such as allyl alcohols, allyl acetate, allyl halides or allyl glycidyl ether; or in which the additional monomer is chosen from combinations thereof.

According to one embodiment, the process comprises a preliminary step of preparing the copolymer (a) according to the process described above.

The subject of the invention is also a film or a membrane comprising at least one copolymer as described above.

The subject of the invention is also a piezoelectric device comprising a film as described above.

The subject of the invention is also a ferroelectric device comprising a film as described above.

The subject of the invention is also a pyroelectric device comprising a film as described above.

The subject of the invention is also a coating comprising a film as described above.

The present invention makes it possible to satisfy the needs existing in the prior art. It more particularly provides a process for controlled free-radical copolymerization of copolymers based on trifluoroethylene (and in particular based on vinylidene fluoride and on trifluoroethylene, or based on vinylidene fluoride and on trifluoroethylene and on a third comonomer) which is simpler and more reliable than the known processes based on the use of boranes.

The invention also provides thermoplastic block copolymers based on trifluoroethylene.

According to certain particular embodiments, the invention also has one or preferably more of the advantageous characteristics listed below.

- The use of the xanthate or trithiocarbonate compound or of the monoiodinated compound makes it possible to control the reaction for free-radical copolymerization of trifluoroethylene and of its comonomers.
- The invention makes it possible to obtain a great variety of block copolymers from polymers or copolymers having a xanthate or trithiocarbonate or monoiodated end group, and from additional comonomers.
- The copolymers according to the invention can be functionalized in a large variety of ways. For example, these copolymers can be used for subsequent crosslinking or grafting steps.
- The invention is particularly useful for the production of piezoelectric, ferroelectric or pyroelectric compounds.

In the above figures, the chemical shift in ppm is indicated along the x-axis.

Figure 9:
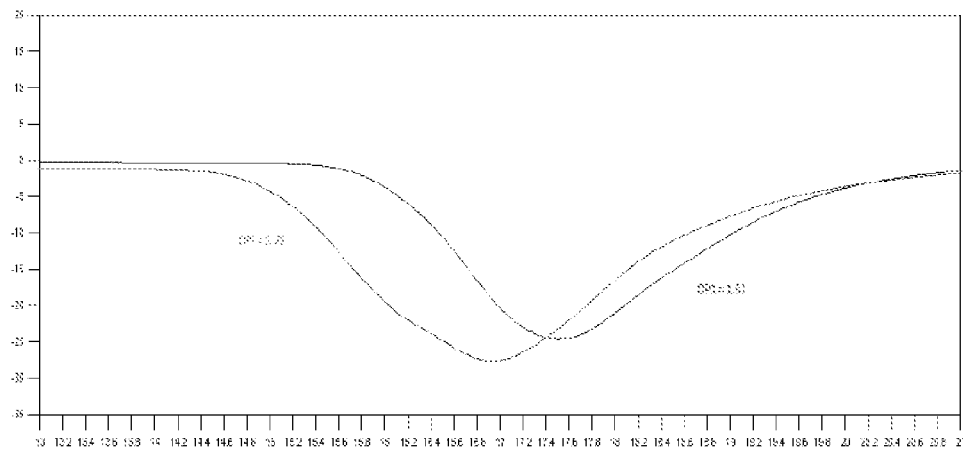

FIG. 9 represents a size exclusion chromatogram (SEC or GPC) of a poly(VDF-co-TrFE) copolymer (see example 2) with a xanthate end group, and of a poly(VDF-co-TrFE)-b-poly(VDF-ter-TrFE-ter-1234yf) block copolymer with a xanthate end group (see example 3).

Figure 10:
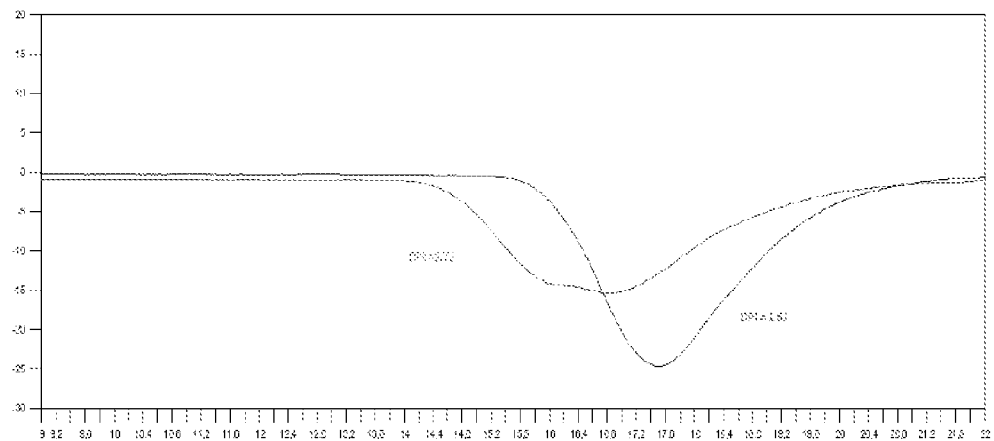

FIG. 10 represents a size exclusion chromatogram (SEC or GPC) of a poly(VDF-co-TrFE) copolymer (see example 2) with a xanthate end group, and of a poly(VDF-co-TrFE)-b-PVDF block copolymer with a xanthate end group (see example 4).

In the above figures, the retention time in minutes appears along the x-axis, and the intensity in mV appears along the y-axis. The highest molar masses correspond to the shortest retention times.

Figure 11:
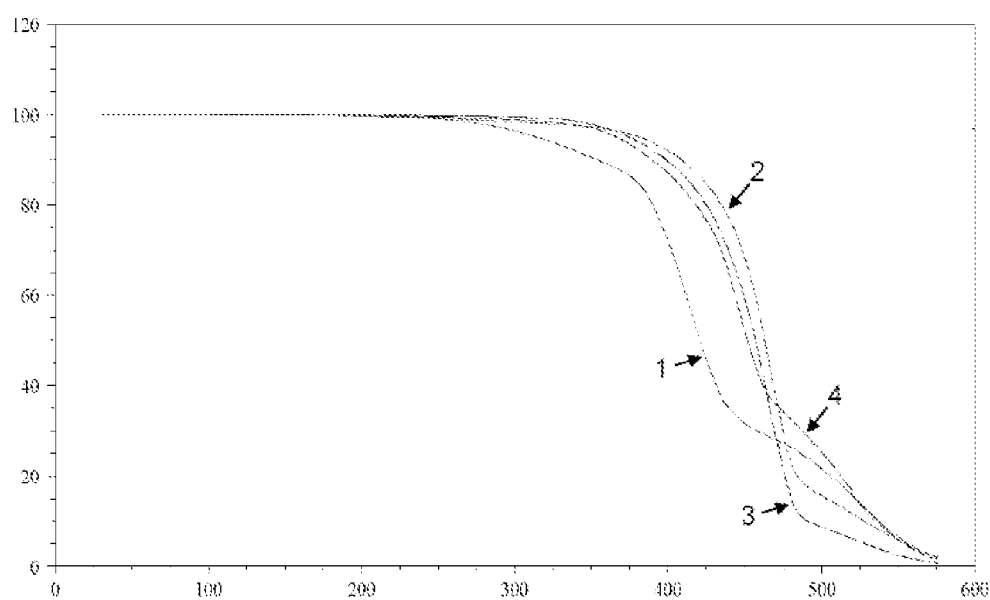

FIG. 11 represents a thermogram of thermogravimetric analysis, carried out under air, of a PVDF-b-poly(VDF-ter-TrFE-ter-1234yf) copolymer with a monoiodinated end group (see example 1), a poly(VDF-co-TrFE) copolymer with a xanthate end group (see example 2), a poly(VDF-co-TrFE)-b-poly(VDF-ter-TrFE-ter-1234yf) copolymer with a xanthate end group (see example 3) and a poly(VDF-co-TrFE)-b-PVDF copolymer with a xanthate end group (see example 4). The numbers indicated on the figure correspond to the numbers of the examples. The temperature in ° C. is indicated along the x-axis, and the % residual mass is indicated along the y-axis.

DESCRIPTION OF EMBODIMENTS OF THE INVENTION

The invention is now described in greater detail and in a nonlimiting manner in the description which follows.

Throughout the description, TrFE or VF$_3$ denote trifluoroethylene, VDF denotes vinylidene fluoride, PVDF denotes poly(vinylidene fluoride), and 1234yf denotes 2,3,3,3-tetrafluoropropene.

The invention provides for preparing a thermoplastic block copolymer by means of a copolymerization reaction between TrFE and at least one additional monomer, optionally several additional monomers, in the presence of a xanthate or trithiocarbonate compound or of a monoiodinated compound as chain transfer agent, making it possible to control the copolymerization reaction.

If a single additional monomer denoted X is used, a copolymer having TrFE units and units corresponding to the additional monomer X is obtained. The copolymer obtained is denoted poly(TrFE-co-X) or poly(X-co-TrFE).

It is particularly advantageous to use VDF as additional monomer, in which case the copolymer obtained is denoted poly(VDF-co-TrFE) or poly(TrFE-co-VDF).

Alternatively, it is possible to use another additional monomer, for example chosen from fluorinated monomers, and preferably from 2,3,3,3-tetrafluoropropene (1234yf), vinyl fluoride, 2-chloro-1,1-difluoroethylene, 2-bromo-1,1-difluoroethylene, hexafluoropropene, 3,3,3-trifluoropropene, 3,3,3-trifluoro-2-chloropropene, 1,1,1,3-tetrafluoropropene, 1H-pentafluoropropene, 2H-pentafluoropropene, 3,3,3-trifluoro-2-bromopropene, perfluoromethyl vinyl ether, perfluoroethyl vinyl ether, perfluoropropyl vinyl ether, α-trifluoromethacrylic acid and its derivatives; or chosen from hydrogenated monomers, and preferably from vinyl acetate, N-vinylpyrrolidone, methacrylates, acrylates, acrylamide, N-vinylcarbazole, acrylonitrile and allyl monomers of allyl alcohol, allyl acetate, allyl halide or allyl glycidyl ether type, for example.

It is also possible to use two, three or more than three different additional monomers. In this case, one of these monomers is preferably VDF.

These additional monomers are preferably chosen from the list above.

By way of example, the invention makes it possible to attain the poly(VDF-ter-TrFE-ter-1234yf) copolymer.

Preferably, the xanthate or trithiocarbonate compound is a compound of formula (I):

$$R_1—S—C(=S)—Z, \qquad (I)$$

in which $R_1$ represents an aliphatic (preferably alkyl) group comprising from 1 to 20 carbon atoms, —Z represents an —O—$R_2$ group in which $R_2$ represents an alkyl or aryl group comprising from 1 to 10 carbon atoms (in this case, it is a xanthate compound) or —Z represents an —S—$R_3$ group in which $R_3$ represents an aliphatic (preferably alkyl) group comprising from 1 to 20 carbon atoms (in this case, it is a trithiocarbonate compound).

It has been noted that the absence of aromatic groups in $R_1$, $R_2$ and/or $R_3$ has a tendency to improve the reaction yield.

The $R_1$, $R_2$ and $R_3$ groups can be substituted or unsubstituted, preferably unsubstituted. Preferably, $R_1$, $R_2$ and $R_3$ are linear or branched groups, and they are preferably saturated groups.

The copolymers obtained according to the process of the invention then have a xanthate or trithiocarbonate end group, i.e. an —S—C(=S)—Z group, or Z has the meaning above, located at the chain end.

It is possible to use a monoiodinated compound in place of the xanthate or trithiocarbonate compound. The xanthate or trithiocarbonate compound has the advantage of producing inverted end groups ($CF_2CH_2$—SC(S)R, with R=alkyl or SR', R' alkyl) which are active, just like the normal end groups ($CH_2CF_2$—SC(S)R, with R=alkyl or SR', R' alkyl), which is not the case with the monoiodinated compound.

Moreover, improved thermostability can be obtained with the copolymers prepared from a xanthate or trithiocarbonate compound, compared with the copolymers prepared from a monoiodinated compound (see FIG. 11 in this regard).

The monoiodinated compound is a compound comprising a single iodine atom. It can in particular be a 1-iodofluoroalkane, and in particular a compound of formula $R_F$—$(CH_2CF_2)_n$—I, in which n is an integer ranging from 1 to 500, and $R_F$ represents a perfluorocarbon group, preferably chosen from the groups $CF_3$, $C_2F_5$, $C_3F_7$ and $C_mF_{2m+1}$, m being an even integer ranging from 4 to 20.

The copolymers obtained according to the process of the invention then have a (single) monoiodinated end group, i.e. a single end iodine atom.

The copolymerization reaction is carried out in the presence of an initiator. Said initiator may, for example, be tert-butyl peroxypivalate, tert-amyl peroxypivalate, bis(4-tert-butylcyclohexyl) peroxydicarbonate, sodium persulfate, ammonium persulfate, potassium persulfate, benzoyl peroxide, tert-butyl hydroxyperoxide, tert-butyl peroxide or 2,5-bis(tert-butylperoxy)-2,5-di methyl hexane.

The reaction is carried out in a solvent, which is, for example, chosen from 1,1,1,3,3-pentafluorobutane, acetonitrile, methyl ethyl ketone, 2,2,2-trifluoroethanol, hexafluoroisopropanol, methyl acetate, ethyl acetate, cyclohexanone and water, and mixtures thereof.

The reaction is preferably carried out at a temperature of from 10 to 200° C., preferably from 35 to 170° C., and at a pressure of from 10 to 120 bar, preferably from 20 to 80 bar. The choice of the optimum temperature depends on the initiator which is used. Generally, the reaction is carried out for at least 6 hours, at a temperature at which the half-life time of the initiator is approximately 1 hour.

The molar ratio of the amount of chain transfer agent to the amount of monomers makes it possible to control the molar mass of the copolymer. Preferably, this ratio is from 0.001 to 0.020, more preferentially from 0.005 to 0.010.

The initial molar ratio of the amount of the TrFE monomer to the amount of the comonomers can be, for example, from 10% to 90%, preferably from 20% to 50%. A copolymer containing approximately 65% of VDF and 35% of TrFE (in molar proportions) is particularly advantageous.

The molar mass of the copolymer obtained is preferably from 10 000 to 400 000 g/mol, more preferentially from 40 000 to 300 000 g/mol. The higher the molar mass, the better the properties of the materials obtained.

The polydispersity index of the copolymer obtained is preferably from 1.2 to 1.9, more preferentially from 1.4 to 1.7.

The copolymer obtained by this synthesis technique can, owing to its xanthate or trithiocarbonate end group or to its monoiodinated end group, in turn be reacted with one (or more) comonomer for the preparation of another block copolymer.

The comonomer(s) can in particular be chosen from those listed above.

The block copolymer thus obtained can comprise (or consist of) a first block and a second block.

The first block can in particular be a copolymer comprising blocks of vinylidene fluoride and of trifluoroethylene or a terpolymer based on vinylidene fluoride, on trifluoroethylene and on 2,3,3,3-tetrafluoropropene (1234yf).

The second block can be a homopolymer, copolymer or terpolymer block.

For example, the second block can be a poly(vinylidene fluoride) block, a terpolymer based on vinylidene fluoride, on trifluoroethylene and on 2,3,3,3-tetrafluoropropene, a terpolymer based on vinylidene fluoride, on trifluoroethylene and on vinyl fluoride, a terpolymer based on vinylidene fluoride, on trifluoroethylene and on de 2-chloro-1,1-difluoroethylene, a terpolymer based on vinylidene fluoride, on trifluoroethylene and on 2-bromo-1,1-difluoroethylene, a terpolymer based on vinylidene fluoride, on trifluoroethylene and on hexafluoropropene, a terpolymer based on vinylidene fluoride, on trifluoroethylene and on de 3,3,3-trifluoropropene, a terpolymer based on vinylidene fluoride, on trifluoroethylene and on 3,3,3-trifluoro-2-chloropropene, a terpolymer based on vinylidene fluoride, on trifluoroethylene and on 1,1,1,3-tetrafluoropropene, a terpolymer based on vinylidene fluoride, on trifluoroethylene and on 3,3,3-trifluoro-2-bromopropene, a terpolymer based on vinylidene fluoride, on trifluoroethylene and on perfluoromethyl vinyl ether, a terpolymer based on vinylidene fluoride, on trifluoroethylene and on 2H-pentafluoropropene, a terpolymer based on vinylidene fluoride, on trifluoroethylene and on 1H-pentafluoropropene, a terpolymer based on vinylidene fluoride, on trifluoroethylene and on perfluoroethyl vinyl ether, a terpolymer based on vinylidene fluoride, on trifluoroethylene and on α-trifluoromethacrylic acid, a terpolymer based on vinylidene fluoride, on trifluoroethylene and on perfluoropropyl vinyl ether, a copolymer based on VDF, on α-trifluoromethacrylic acid or on an α-trifluoromethacrylic acid derivative, or a poly(vinyl acetate), polyvinylpyrrolidone, poly(alkyl methacrylate), poly(alkyl acrylate), polyacrylamide, polyvinylcarbazole or polyacrylonitrile block.

Conditions analogous to those described above can be used for this reaction for producing block copolymers. The molar ratio of the amount of comonomer to the amount of copolymer with a xanthate or trithiocarbonate or monoiodinated end group is preferably from 1 to 200, more preferentially from 5 to 100.

The copolymers obtained according to the invention are of use in particular for the production of electrolytes or for the production of membranes. They are also of use for the production of piezoelectric, ferroelectric or pyroelectric devices and also of coatings.

EXAMPLES

The following examples illustrate the invention without limiting it.

Example 1

Synthesis of PVDF-b-poly(VDF-ter-TrFE-ter-1234yf)

The synthesis of the PVDF-b-poly(VDF-ter-TrFE-ter-1234yf) block polymer was carried out in two steps, as follows:

The reactor is gradually heated to 74° C., and the changes in pressure and in temperature are recorded. During the polymerization, an increase in the pressure inside the reactor is observed, due to the exothermicity of the reaction, followed by a decrease in said pressure, caused by the conversion of the gaseous fluorinated monomers into the desired polymer. At 74° C., the pressure is close to 35 bar (a rapid increase in the temperature to 78° C. is observed, thereby showing that the reaction is exothermic). During the hour following this exotherm, the pressure decreases from 35 bar to 12 bar with a temperature maintained at 74° C. After reaction and cooling, the reactor is left in ice for 30 min and then degassed (release of the unreacted fluorinated monomers). After the reactor has been opened, the solvent is eliminated by distillation and then the product is precipitated from cold pentane, filtered and dried under vacuum ($10^{-2}$ bar, 60° C.) until the weight is constant. The PVDF-b-poly(VDF-ter-TrFE-ter-1234yz) block copolymer, in the form of a white powder, is characterized by $^1$H NMR (FIG. 1) and $^{19}$F NMR (FIG. 2) spectroscopy. The calculated yield is 78%.

Figure 1:
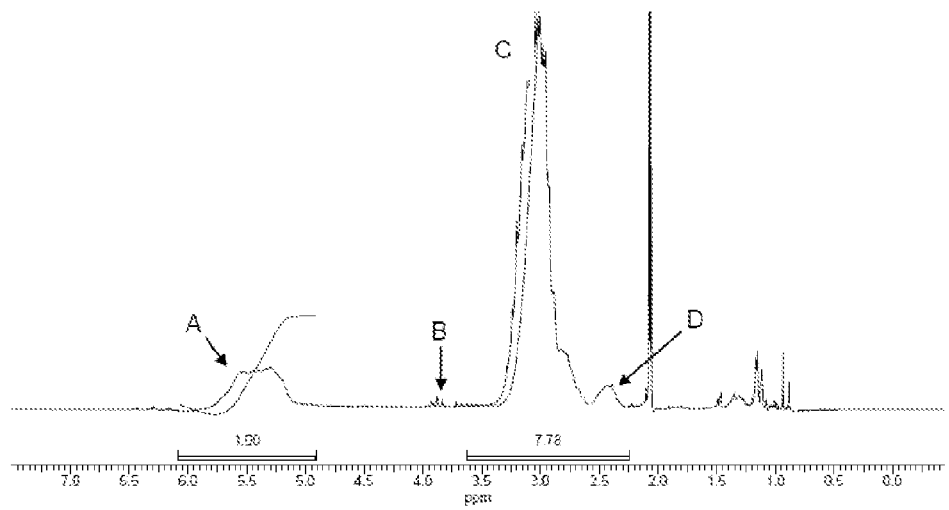
FIG. 1 represents a $^1$H NMR spectrum in deuterated acetone of a PVDF-b-poly(VDF-ter-TrFE-ter-1234yf) block copolymer (see example 1).

In FIG. 1, the reference A denotes the CFH group of TrFE; the reference B denotes the $CF_2C\underline{H}_2$—I group; the reference C denotes the normal diads —$CH_2CF_2$—$C\underline{H}_2CF_2$— of VDF and $CH_2$ of 1234yf; and the reference D denotes the inverse diads —$CF_2C\underline{H}_2$—$C\underline{H}_2CF_2$— of VDF. The calculated proportion of TrFE is 20 mol %.

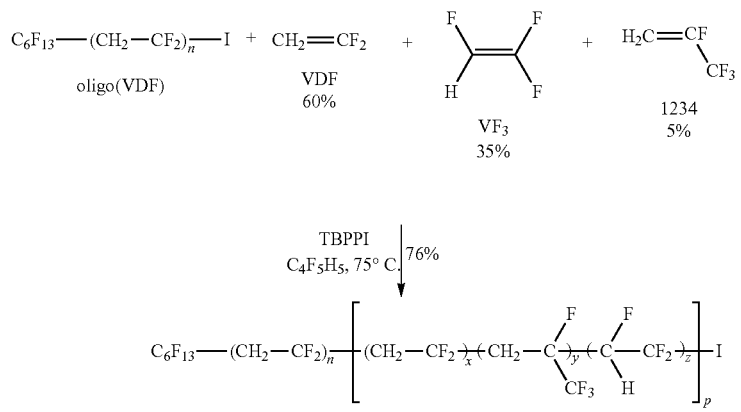

First of all, the $C_6F_{13}$I controlled free-radical polymerization of the VDF was carried out according to the protocol described in the article entitled *Iodine transfer polymerization (ITP) of vinylidene fluoride (VDF)—Influence of the defect of VDF chaining on the control of ITP* published in *Macromolecules*, 38, 10353-10362 (2005).

The free-radical copolymerization is carried out in a 100 mL Parr Hastelloy autoclave equipped with a manometer, with a rupture disk and with gas-introduction and release valves. A regulated electronic device controls both the stirring and the heating of the autoclave. The VDF-based telomers $C_6F_{13}(VDF)_n$—I (6.2 g, 0.026 mol, 2%, $DP_n$=26) are introduced into the autoclave. It is then pressurized to 30 bar of nitrogen for 1 h in order to verify the leaktightness thereof. Once the nitrogen has been evacuated, the reactor is placed under vacuum for 40 min, then t-butyl peroxypivalate TBPPI (0.60 g, 3.47 mmol) and 60 mL of 1,1,1,3,3-pentafluorobutane are introduced therein. The reactor is then cooled to −60° C. (acetone/liquid nitrogen mixture), then 1,1,2-trifluoroethylene or TrFE (7.47 g, 0.091 mol), 2,3,3,3-tetrafluoro-2-propene or 1234yf (1.49 g, 0.013 mol) and vinylidene fluoride or VDF (10 g, 0.156 mol) are then successively introduced therein.

Figure 2:
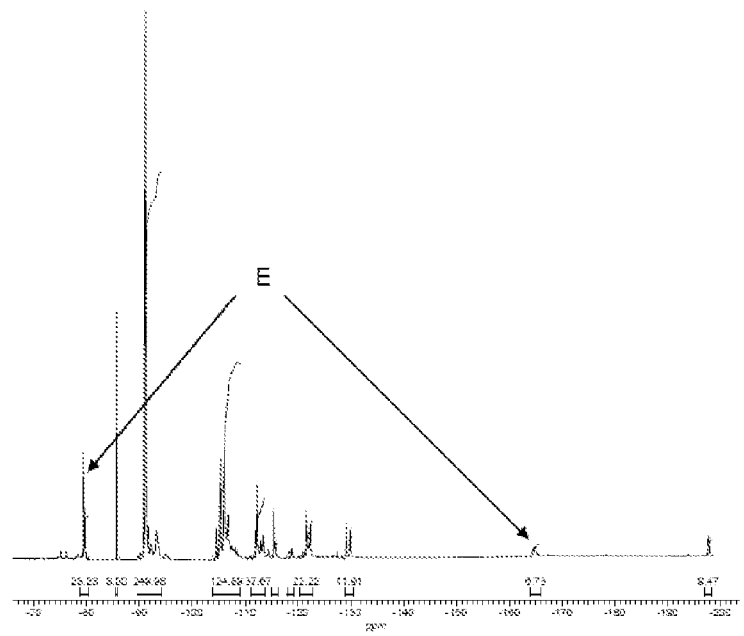
FIG. 2 represents a $^{19}$F NMR spectrum in deuterated acetone of the same block copolymer.

In FIG. 2, the reference E denotes 1234yf.

The TGA thermogram (carried out under air) of the copolymer is visible in FIG. 11 (curve no. 1).

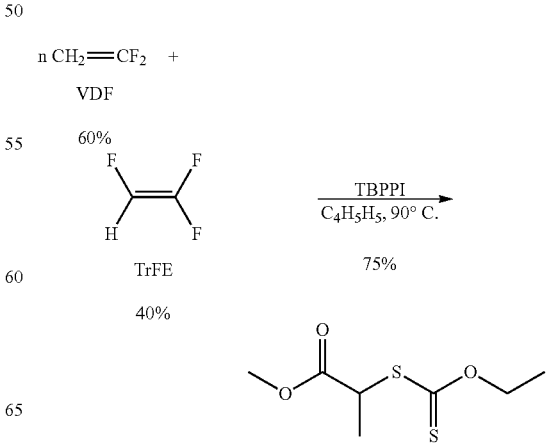

-continued

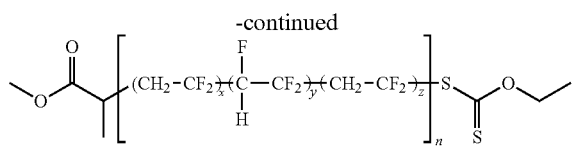

Poly(VDF-co-TrFE)

62% of VDF: 38% of TrFE

Example 2

Synthesis of poly(VDF-co-TrFE)-SC(S)OEt

This copolymerization is carried out as previously in a 100 mL HC-276 reactor by introducing therein respectively t-butyl peroxypivalate (0.904 g, 5.2 mmol), 2-mercaptopropionic acid methyl ester O-ethyl dithiocarbonate (Rhodixan; 0.811 g, 3.9 mmol) and 50 mL of 1,1,1,3,3-pentafluorobutane. The reactor is then cooled to −60° C. (acetone/liquid nitrogen mixture), then the TrFE (12.81 g, 0.156 mol) followed by the VDF (15 g, 0.234 mmol) are then successively introduced therein.

The reactor is gradually heated to 74° C., and the changes in pressure and in temperature are recorded. During the polymerization, an increase in the pressure inside the reactor is observed, due to the exothermicity of the reaction, and then a decrease in said temperature, caused by the consumption of the gaseous fluorinated monomers to give the desired polymer. At 74° C., the pressure is close to 22 bar (linked to the exothermicity up to 76° C.).

During the hour following this exotherm, the pressure drops to 7 bar for a temperature maintained at 74° C. As previously, after reaction and cooling, the reactor is left in ice for 30 min and then degassed. After the reactor has been opened, the solvent is distilled off. The product is precipitated from cold pentane, filtered and dried under vacuum ($10^{-2}$ bar, 60° C.) for 14 hours. The poly(VDF-co-TrFE)-SC(S)OEt copolymer, in the form of a white powder, is characterized by $^1$H NMR (FIG. 3) and $^{19}$F NMR (FIG. 4) spectroscopy. The calculated yield is 75%.

Figure 3:
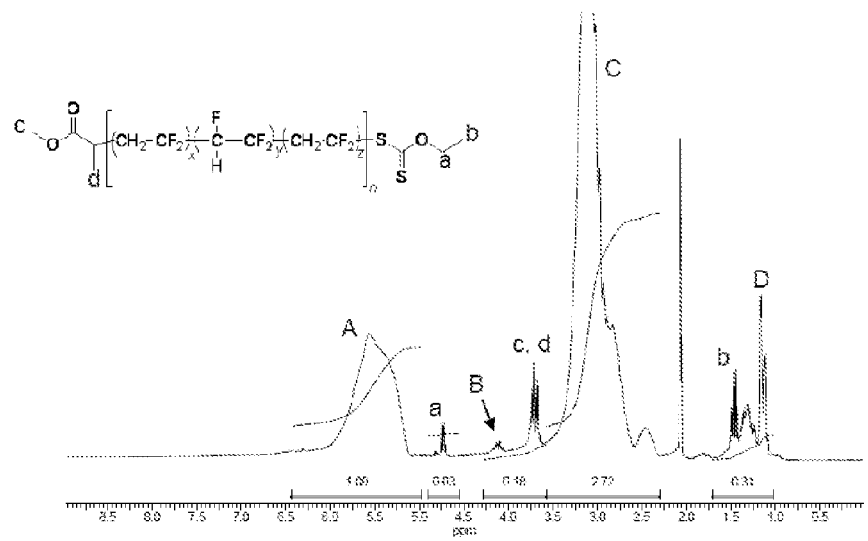
FIG. 3 represents a $^1$H NMR spectrum in deuterated acetone of a poly(VDF-co-TrFE) copolymer (see example 2) with a xanthate end group.

In FIG. 3, the reference A denotes the CHF group; the reference B denotes the —CF$_2$CH$_2$SC(S)OEt group; the reference C denotes —CH$_2$CF$_2$—CH$_2$CF$_2$—; and the reference D denotes the tBu-VDF group. Moreover, the references a, b, c and d correspond to the positions indicated on the illustrated formula of the copolymer.

Figure 4:
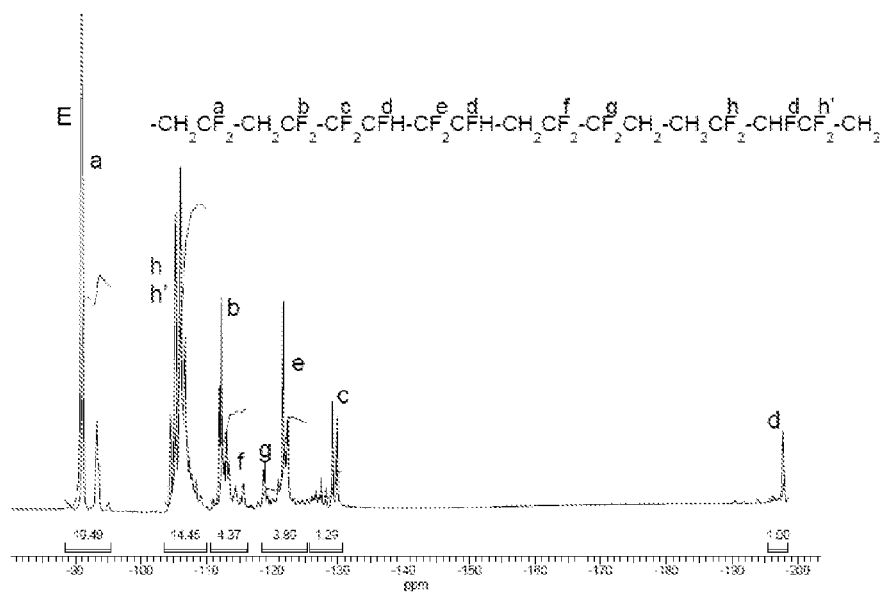
FIG. 4 represents a $^{19}$F NMR spectrum in deuterated acetone of the same copolymer.

In FIG. 4, the reference E denotes —CH$_2$CF$_2$—CH$_2$. Moreover, the references a, b, c, d, e, f, g, h and h' correspond to the positions indicated on the illustrated formula of the copolymer.

The GPC chromatogram of the copolymer can be seen in FIGS. 9 and 10. The molar mass of this copolymer is 40 000 g/mol (PMMA equivalent) and its polydispersity index DPI is 1.61.

The TGA thermogram of the copolymer can be seen in FIG. 11 (curve no. 2).

Example 3

Synthesis of poly(VDF-co-TrFE)-b-poly(VDF-ter-TrFE-ter-1234) Block Polymer

This copolymerization is carried out by introducing the copolymers based on VDF and TrFE of example 2 (6.2 g, 0.026 mol, 2%) into the autoclave. The reactor is placed under vacuum for 40 min, then t-butyl peroxypivalate (0.60 g, 3.47 mmol) and 60 mL of 1,1,1,3,3-pentafluorobutane are introduced therein. The reactor is then cooled to −60° C., and the TrFE (7.47 g, 0.091 mol), the 1234yf (1.49 g, 0.013 mol), and, finally, the VDF (10 g, 0.156 mmol) are then respectively introduced therein. The reactor is gradually heated to 74° C., and the changes in pressure and temperature are reported.

During the polymerization, an increase in the pressure inside the reactor is observed, due to the exothermicity of the reaction, then a decrease in said pressure, caused by the conversion of the gaseous fluorinated monomers into the desired polymer in solution. At 74° C., the pressure is close to 42 bar (a rapid increase in the temperature to 79° C. is observed). During the hour following this exotherm, the pressure decreases from 42 bar to 11 bar with a temperature maintained at 74° C. After reaction and cooling, the reactor is left in ice for 30 min and then degassed.

Figure 5:
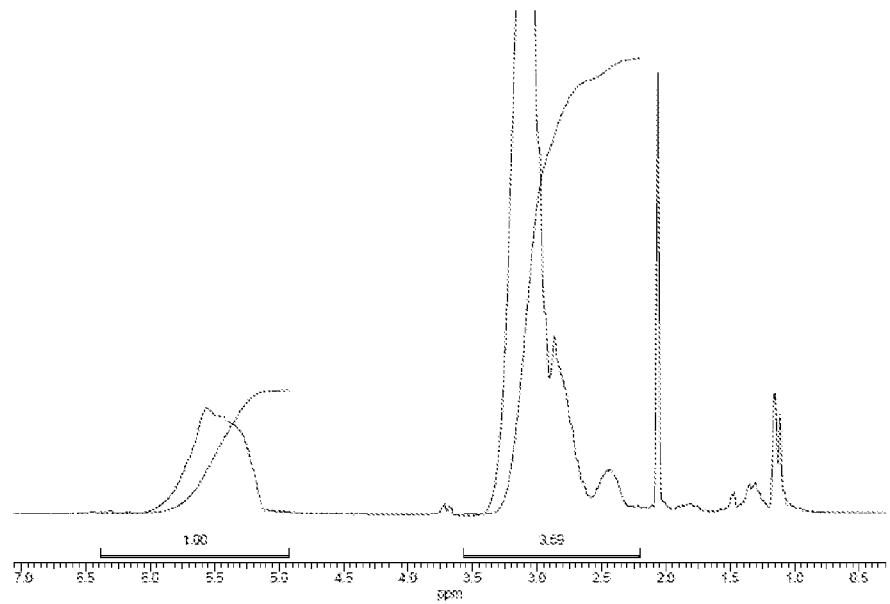
FIG. 5 represents a $^1$H NMR spectrum in deuterated acetone of a poly(VDF-co-TrFE)-b-poly(VDF-ter-TrFE-ter-1234yf) block copolymer with a xanthate end group (see example 3).

After the reactor has been opened, the solvent is completely eliminated by distillation, and the copolymer is precipitated from ice-cold pentane, filtered and dried under vacuum ($10^{-2}$ bar, 60° C.) for 14 hours. The desired copolymer, in the form of a white powder, is characterized by $^1$H NMR (FIG. 5) and $^{19}$F NMR (FIG. 6) spectroscopy. The calculated yield is 81%.

Figure 6:
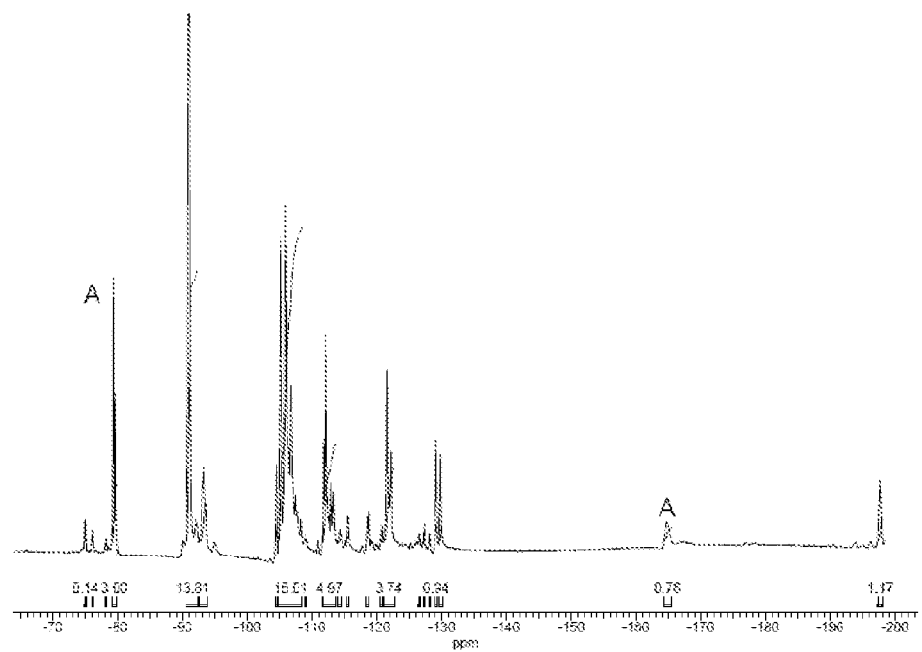
FIG. 6 represents a $^{19}$F NMR spectrum in deuterated acetone of the same block copolymer.

In FIG. 6, the double reference A indicates the presence of 1234yf.

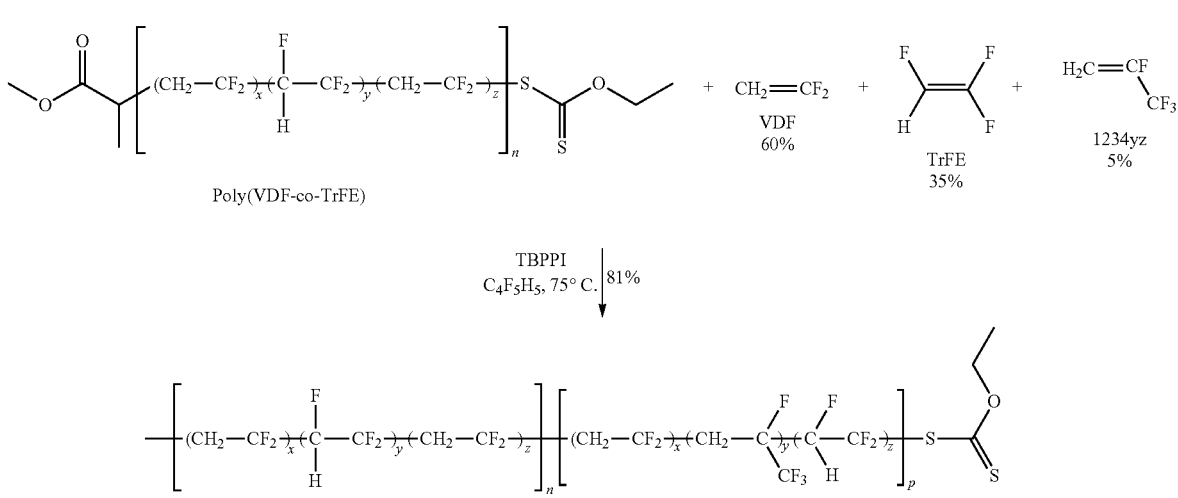

The GPC chromatogram of the copolymer can be seen in FIG. 9. The molar mass of the block copolymer is 55 000 g/mol (PMMA equivalent) and the DPI is 1.71. The TGA thermogram of the copolymer can be seen in FIG. 11 (curve no. 3).

Example 4

Synthesis of poly(VDF-co-TrFE)-b-PVDF Block Copolymer

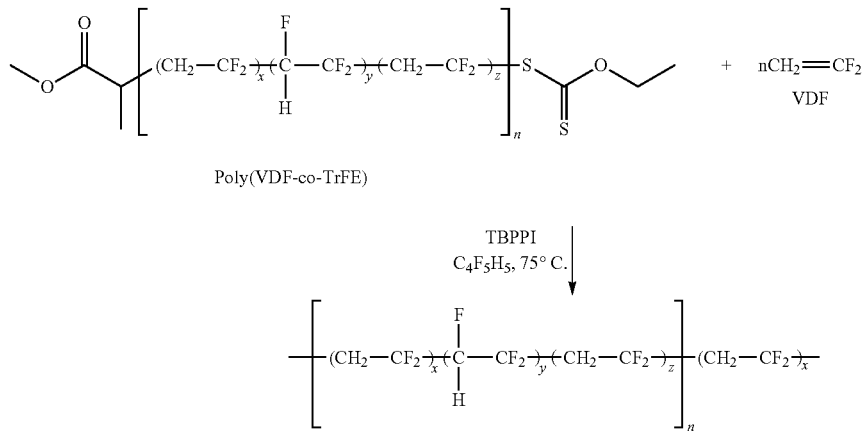

This copolymerization is carried out by introducing the copolymer based on VDF and TrFE, with a xanthate end group, synthesized in example 2 (6.2 g, 0.026 mol, 2%) into the autoclave. The reactor is placed under vacuum for 40 min, then t-butyl peroxypivalate (0.43 g, 1.87 mmol) and 60 mL of 1,1,1,3,3-pentafluorobutane are introduced therein. The reactor is then cooled to −60° C. (acetone/liquid nitrogen mixture), then the VDF (12 g, 0.187 mmol) is introduced therein. The reactor is gradually heated to 74° C., and the changes in pressure and temperature are recorded.

During the polymerization, an increase in the pressure inside the reactor is observed, due to the exothermicity of the reaction, then a decrease in said pressure, caused by the consumption of the gaseous VDF to give the desired polymer. At 74° C., the pressure is close to 25 bar (a rapid increase in the temperature to 76° C. is observed), and then down to 7 bar (the temperature being maintained at 74° C.). After reaction and cooling, the reactor is left in ice for 30 min and then degassed. After the reactor has been opened, the solvent is eliminated by distillation and then the residue is precipitated from cold pentane, filtered and dried under vacuum ($10^{-2}$ bar, 60° C.) until the weight is constant.

Figure 7:
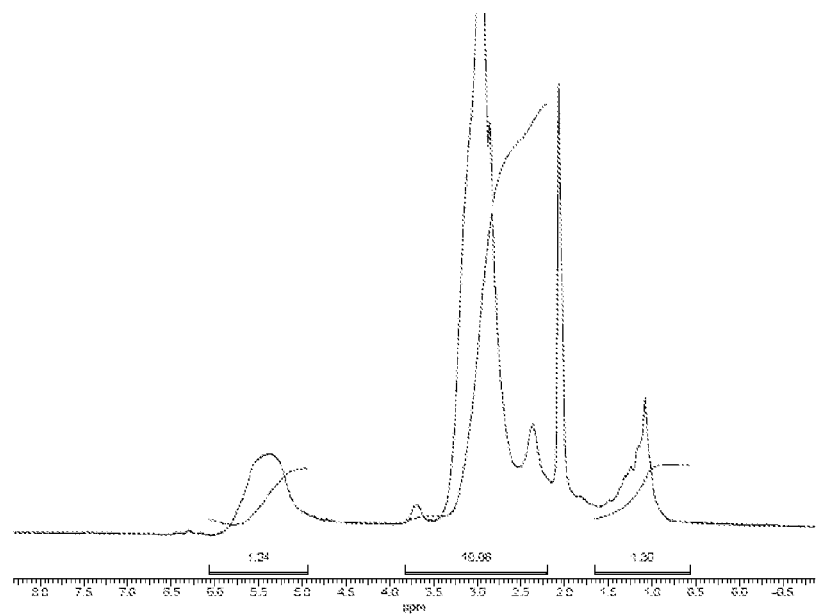
FIG. 7 represents a $^1$H NMR spectrum in deuterated acetone of a poly(VDF-co-TrFE)-b-PVDF block copolymer with a xanthate end group (see example 4).
Figure 8:
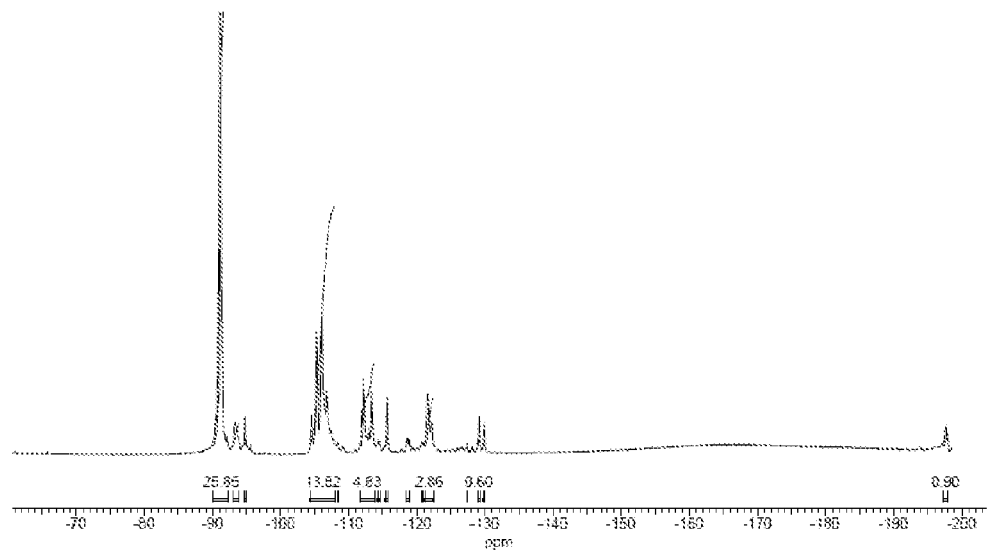
FIG. 8 represents a $^{19}$F NMR spectrum in deuterated acetone of the same block copolymer.

The desired copolymer, in the form of a white powder, is characterized by $^1$H NMR (FIG. 7) and $^{19}$F NMR (FIG. 8) spectroscopy. The calculated yield is 79%.

The GPC chromatogram of the copolymer can be seen in FIG. 10. The molar mass of this block copolymer is 43 000 g/mol (PMMA equivalent) and the DPI is 1.72.

The TGA thermogram of the copolymer can be seen in FIG. 11 (curve no. 4).

The invention claimed is:

1. A thermoplastic block copolymer, comprising:
   a poly(vinylidene fluoride) homopolymer block and a copolymer block comprising vinylidene fluoride and trifluoroethylene units and optionally additional units; or
   a copolymer block comprising vinylidene fluoride and trifluoroethylene units and a copolymer block comprising vinylidene fluoride and trifluoroethylene units and additional units,
   said thermoplastic block copolymer having a xanthate or trithiocarbonate or monoiodinated end group.

2. A thermoplastic block copolymer according to claim 1 having trifluoroethylene and vinylidene fluoride units and additional units, and having a xanthate or trithiocarbonate or monoiodinated end group.

3. The copolymer as claimed in claim 2, in which the xanthate or trithiocarbonate end group is an —S—C(═S)—Z group, —Z representing an —O—R$_2$ group in which R$_2$ represents an alkyl or aryl group comprising from 1 to 10 carbon atoms or —Z representing an —S—R$_3$ group in which R$_3$ represents an aliphatic group comprising from 1 to 20 carbon atoms.

4. The copolymer as claimed in claim 3, in which the xanthate or trithiocarbonate end group is an —S—C(═S)—O—C$_2$H$_5$ or —S—C(═S)—S—C$_{12}$H$_{25}$ group.

5. A process for preparing a copolymer (c), comprising reacting a copolymer (a) as claimed in claim 2 with at least one comonomer (b).

6. The process as claimed in claim 5, in which the comonomer (b) is a fluorinated monomers or a combination thereof.

7. The process according to claim 6, wherein the comonomer (b) is 2,3,3,3-tetrafluoropropene, vinyl fluoride, 2-chloro-1,1-difluoroethylene, 2-bromo-1,1-difluoroethylene, hexafluoropropene, 3,3,3-trifluoropropene, 3,3,3-trifluoro-2-chloropropene, 1,1,1,3-tetrafluoropropene, 3,3,3-trifluoro-2-bromopropene, 1H-pentafluoropropene, 2H-pentafluoropropene, perfluoromethyl vinyl ether, perfluoroethyl vinyl ether, perfluoropropyl vinyl ether, α-trifluoromethacrylic acid and its derivatives; vinyl acetate, N-vinylpyrrolidone, methacrylates, acrylates, acrylamide, N-vinylcarbazole, acrylonitrile, allyl alcohol, allyl acetate, allyl halide or allyl glycidyl ether units; or are combinations thereof.

8. The process as claimed in claim 5, comprising preparing the copolymer (a) by controlled free-radical copolymerization, comprising copolymerization of a trifluoroethylene monomer with at least one additional monomer, different than trifluoroethylene, in the presence of an initiator and of a chain transfer agent, said chain transfer agent being a xanthate compound, a trithiocarbonate compound or a monoiodinated compound, in which the copolymer prepared is a block copolymer and in which the molar ratio of the amount of chain transfer agent to the amount of monomers is from 0.001 to 0.020, and the initial molar ratio of the amount of the TrFE monomer to the amount of the comonomers is from 10% to 90%, preferably from 20% to 50%.

9. A film or membrane comprising at least one copolymer as claimed in claim 2.

10. A piezoelectric device comprising a film as claimed in claim 9.

11. A ferroelectric device comprising a film as claimed in claim 9.

12. A pyroelectric device comprising a film as claimed in claim 9.

13. A coating comprising a film as claimed in claim 9.

14. The copolymer as claimed in claim 1, in which the additional units are fluorinated units or combinations thereof.

15. The block copolymer as claimed in claim 14, in which: the additional units are 2,3,3,3-tetrafluoropropene, vinyl fluoride, 2-chloro-1,1-difluoroethylene, 2-bromo-1,1-difluoroethylene, hexafluoropropene, 3,3,3-trifluoropropene, 3,3,3-trifluoro-2-chloropropene, 1,1,1,3-tetrafluoropropene, 3,3,3-trifluoro-2-bromopropene, 1H-pentafluoropropene, 2H-pentafluoropropene, perfluoromethyl vinyl ether, perfluoroethyl vinyl ether, perfluoropropyl vinyl ether, α-trifluoromethacrylic acid and its derivatives; vinyl acetate, N-vinylpyrrolidone, methacrylates, acrylates, acrylamide, N-vinylcarbazole, acrylonitrile, allyl alcohol, allyl acetate, allyl halide or allyl glycidyl ether units; or are combinations thereof.

16. The block copolymer as claimed in claim 1, comprising:
a poly(vinylidene fluoride) homopolymer block and a copolymer block comprising vinylidene fluoride, trifluoroethylene and 2,3,3,3-tetrafluoropropene units; or
a copolymer block comprising vinylidene fluoride and trifluoroethylene units and a copolymer block comprising vinylidene fluoride, trifluoroethylene and 2,3,3,3-tetrafluoropropene units; or
a poly(vinylidene fluoride) homopolymer block and a copolymer block consisting of vinylidene fluoride and trifluoroethylene units.

17. The process for preparing a copolymer according to claim 1 by controlled free-radical copolymerization, comprising copolymerization of a trifluoroethylene monomer with at least one additional monomer, different than trifluoroethylene, in the presence of an initiator and of a chain transfer agent, said chain transfer agent being a xanthate compound, a trithiocarbonate compound or a monoiodinated compound, in which the copolymer prepared is a block copolymer and the monomers present during the copolymerization step comprise vinylidene fluoride, trifluoroethylene, and at least one additional monomer, and in which the molar ratio of the amount of chain transfer agent to the amount of monomers is from 0.001 to 0.020, and the initial molar ratio of the amount of the TrFE monomer to the amount of the comonomers is from 10% to 90%.

18. The process as claimed in claim 1, in which the additional monomers are 2,3,3,3-tetrafluoropropene, vinyl fluoride, 2-chloro-1,1-difluoroethylene, 2-bromo-1,1-difluoroethylene, hexafluoropropene, 3,3,3-trifluoropropene, 3,3,3-trifluoro-2-chloropropene, 1,1,1,3 tetrafluoropropene, 3,3,3-trifluoro-2-bromopropene, 1H-pentafluoropropene, 2H-pentafluoropropene, perfluoromethyl vinyl ether, perfluoroethyl vinyl ether, perfluoropropyl vinyl ether, α-trifluoromethacrylic acid or its derivatives; vinyl acetate, N-vinylpyrrolidone, methacrylates, acrylates, acrylamide, N-vinylcarbazole, acrylonitrile, allyl alcohols, allyl acetate, allyl halides, allyl glycidyl ether; or are combinations thereof.

19. The process as claimed in claim 1, in which the chain transfer agent is a xanthate or trithiocarbonate compound which is a compound of formula $R_1$—S—C(=S)—Z, in which $R_1$ represents an aliphatic group comprising from 1 to 20 carbon atoms, —Z represents an —O—$R_2$ group in which $R_2$ represents an alkyl or aryl group comprising from 1 to 10 carbon atoms or —Z represents an —S—$R_3$ group in which $R_3$ represents an aliphatic group comprising from 1 to 20 carbon atoms.

20. The process as claimed in claim 19, in which the xanthate or trithiocarbonate compound is O-ethyl-S-(1-methyloxycarbonyl)ethyl xanthate.

21. The process as claimed in claim 1, in which the chain transfer agent is a monoiodinated compound which is a 1-iodofluoroalkane.

22. The process according to claim 21, wherein the monoiodinated compound is a compound of formula $R_F$—$(CH_2CF_2)_N$—I, in which n is an integer ranging from 1 to 500, and $R_F$ represents a perfluorocarbon group.

23. The process according to claim 22, wherein $R_F$ is $CF_3$, $C_2F_5$, $C_3F_7$ or $C_mF_{2m+1}$, m being an even integer ranging from 4 to 20.

* * * * *